(12) United States Patent
Oh (10) Patent No.: US 12,539,531 B2
(45) Date of Patent: Feb. 3, 2026

(54) APPARATUS FOR PROCESSING A SUBSTRATE

(71) Applicant: SEMES CO., LTD., Cheonan-si (KR)

(72) Inventor: Youngkyu Oh, Cheonan-si (KR)

(73) Assignee: SEMES CO., LTD., Chungcheongnam-Do (KR)

(*) Notice: Subject to any disclaimer, the term of this patent is extended or adjusted under 35 U.S.C. 154(b) by 138 days.

(21) Appl. No.: 18/063,387

(22) Filed: Dec. 8, 2022

(65) Prior Publication Data

US 2023/0201891 A1    Jun. 29, 2023

(30) Foreign Application Priority Data

Dec. 24, 2021 (KR) .................. 10-2021-0187013
May 2, 2022 (KR) .................. 10-2022-0054144

(51) Int. Cl.
*B08B 9/032* (2006.01)

(52) U.S. Cl.
CPC .......... *B08B 9/0325* (2013.01); *B08B 9/0323* (2013.01); *B08B 2209/032* (2013.01)

(58) Field of Classification Search
None
See application file for complete search history.

(56) References Cited

U.S. PATENT DOCUMENTS

| 7,650,691 B2 | 1/2010 | Narita et al. |
| 2003/0159716 A1* | 8/2003 | Nagai ............ B08B 3/02 134/21 |

FOREIGN PATENT DOCUMENTS

| JP | H5-253853 A | 10/1993 |
| JP | 2014114085 A | * 6/2014 |
| KR | 10-2007-0115357 A | 12/2007 |
| KR | 10-2011-0097615 A | 8/2011 |
| KR | 10-2017-0024213 A | 3/2017 |
| KR | 10-2020-0022678 A | 3/2020 |

OTHER PUBLICATIONS

JP2014114085—Machine Translation (Year: 2014).*
Japanese Office Action dated Sep. 24, 2024 issued in Japanese Patent Application No. 2022-203033.

* cited by examiner

*Primary Examiner* — Marc Lorenzi
(74) *Attorney, Agent, or Firm* — Harness, Dickey & Pierce, P.L.C.

(57) ABSTRACT

An apparatus for processing a substrate may include a vacuum suction part including vacuum holes configured to apply a vacuum pressure to a rear face of a substrate while a predetermined process is performed on the substrate, and a cleaning part configured to clean the vacuum holes in a cleaning process of cleaning the vacuum holes. The cleaning part may include a cleaning solution supply part configured to provide a cleaning solution into the vacuum holes, and a cleaning solution discharge part configured to discharge the cleaning solution from the vacuum holes.

8 Claims, 5 Drawing Sheets

APPARATUS FOR PROCESSING A SUBSTRATE

CROSS-REFERENCE TO RELATED APPLICATION

This application claims priorities to Korean Patent Application No. 2021-0187013 filed on Dec. 24, 2021 and Korean Patent Application No. 2022-0054144 filed on May 2, 2022 in the Korean Intellectual Property Office (KIPO), the contents of which are herein incorporated by reference in their entireties.

BACKGROUND

1. Field

Example embodiments of the invention relate to an apparatus for processing a substrate. More particularly, example embodiments of the invention relate to an apparatus for processing a substrate having vacuum hole capable of absorbing a substrate in a vacuum adsorption manner awhile performing a predetermined process on the substrate.

2. Related Technology

In various manufacturing processes for a display device or a semiconductor device, a predetermined process may be performed on a substrate after absorbing the substrate in a vacuum adsorption manner. For example, a chemical liquid may be supplied on to a substrate while transferring the substrate over a floating stage by absorbing the substrate in a vacuum adsorption manner.

In a conventional process of supplying a chemical liquid onto a substrate, the substrate may be levitated over a floating stage by spraying an air onto a rear face of the substrate and by applying a vacuum pressure to the rear face of the substrate. The floating stage generally includes air holes for providing the air onto the rear face of the substrate and vacuum holes for applying the vacuum pressure to the rear face of the substrate. Here, the chemical liquid may include a photoresist solution.

In the process of coating the photoresist solution on a substrate, a fume may be generated from the photoresist solution at a peripheral portion of the substrate and such fume may be flow into the vacuum holes. The fume flowed into the vacuum holes may be attached on insides of the vacuum holes and an extraneous matter containing such fume and/or other impurities mat be attached on the insides of the vacuum holes. Therefore, the vacuum holes may be partially or entirely blocked the attached extraneous matter. To remove the extraneous matter from the vacuum holes, an air may be sprayed into the vacuum holes, however, the spraying of air may not completely remove the extraneous matter from the insides of vacuum holes as well as may cause the scattering of the extraneous matter to an outside of the vacuum holes.

SUMMARY

It is an object of the invention to provide an apparatus for processing a substrate which may completely remove extraneous matter attached on insides of vacuum holes while preventing scattering of the extraneous matter outside of the vacuum holes.

According to an aspect of the invention, there is provided an apparatus for processing a substrate. The apparatus for processing a substrate may include a vacuum suction part including vacuum holes configured to apply a vacuum pressure to a rear face of a substrate while a predetermined process is performed on the substrate, and a cleaning part configured to clean the vacuum holes in a cleaning process of cleaning the vacuum holes. The cleaning part may include a cleaning solution supply part configured to provide a cleaning solution into the vacuum holes, and a cleaning solution discharge part configured to discharge the cleaning solution from the vacuum holes.

In example embodiments, the cleaning solution supply part may include a supply line in fluid communication with the vacuum holes and a supply valve for opening and closing the supply line. The cleaning solution discharge part may include a discharge line in fluid communication with the vacuum holes and a discharge valve for opening and closing the discharge line. The supply valve may close the supply line and the discharge valve may close the discharge line in the predetermined process. The supply valve may open the supply line and the discharge valve may close the discharge line to provide the cleaning solution into the vacuum holes in the cleaning process. The supply valve may close the supply line and the discharge valve may open the discharge line to discharge the cleaning solution from the vacuum holes in the cleaning process.

In some example embodiments, the supply line of the cleaning solution supply part may include a main supply line; and a branched supply lines divided from the main supply line and in fluid communication with the vacuum holes, respectively. The supply valve may be disposed in the main supply line. The discharge line of the cleaning solution discharge part may include a main discharge line and a branched discharge lines divided from the main discharge line and in fluid communication with the vacuum holes, respectively. The discharge valve may be disposed in the main discharge line.

In other example embodiments, the cleaning solution supply part may include a main supply line and common branched lines connected to the main supply line. The common branched lines may be in fluid communication with the vacuum holes. The cleaning solution discharge part may include a main discharge line and the common branched lines connected to the main discharge line.

In example embodiments, the cleaning solution supply part may additionally include a supply valve for opening and closing the main supply line. The cleaning solution discharge part may additionally include a discharge valve for opening and closing the main discharge line. The supply valve may close the supply line and the discharge valve may close the discharge line in the predetermined process. The supply valve may open the supply line and the discharge valve may close the discharge line to provide the cleaning solution into the vacuum holes in the cleaning process. The supply valve may close the supply line and the discharge valve may open the discharge line to discharge the cleaning solution from the vacuum holes in the cleaning process.

In other example embodiments, the cleaning part may additionally include a three way valve disposed at a connection point among the main supply line, the main discharge line and the common branched lines. The three way valve may be opened toward the common branched lines in the predetermined process. The three way valve may be opened toward the main supply line and the common branched lines to provide the cleaning solution into the vacuum holes in the cleaning process. The three way valve may be opened toward the main discharge line and the common branched lines to discharge the cleaning solution from the vacuum holes in the cleaning process.

In example embodiments, the apparatus for processing a substrate may additionally include a flow measurement part configured to provide the cleaning solution into the vacuum holes by a previously set amount, and a pumping part configured to discharge the cleaning solution from the vacuum holes for a previously set time.

In example embodiments, the predetermined process may include a process of supplying a chemical liquid onto the substrate, and a fume may be generated from the chemical liquid. The cleaning solution may remove an extraneous matter containing the fume attached on insides of the vacuum holes.

According to another aspect of the invention, there is provided an apparatus for processing a substrate. The apparatus for processing a substrate may include a floating stage comprising air holes configured to provide an air onto a rear face of a substrate and vacuum holes configured to apply a vacuum pressure to the rear face of the substrate while a predetermined process is performed on the substrate, and a cleaning part configured to clean the vacuum holes in a cleaning process of cleaning the vacuum holes. The cleaning part may include a cleaning solution supply part configured to provide a cleaning solution into the vacuum holes, and a cleaning solution discharge part configured to discharge the cleaning solution from the vacuum holes.

In some example embodiments, the cleaning solution supply part may include a supply line in fluid communication with the vacuum holes and a supply valve for opening and closing the supply line. The cleaning solution discharge part may include a discharge line in fluid communication with the vacuum holes and a discharge valve for opening and closing the discharge line. The supply valve may close the supply line and the discharge valve may close the discharge line in the predetermined process. The supply valve may open the supply line and the discharge valve may close the discharge line to provide the cleaning solution into the vacuum holes in the cleaning process. The supply valve may close the supply line and the discharge valve may open the discharge line to discharge the cleaning solution from the vacuum holes in the cleaning process.

In other example embodiments, the supply line of the cleaning solution supply part may include a main supply line and a branched supply lines divided from the main supply line and in fluid communication with the vacuum holes, respectively. The supply valve may be disposed in the main supply line. The discharge line of the cleaning solution discharge part may include a main discharge line and a branched discharge lines divided from the main discharge line and in fluid communication with the vacuum holes, respectively. The discharge valve may be disposed in the main discharge line.

In some example embodiments, the cleaning solution supply part may include a main supply line, common branched lines connected to the main supply line and a supply valve for opening and closing the main supply line. The common branched lines may be in fluid communication with the vacuum holes. The cleaning solution discharge part may include a main discharge line, the common branched lines connected to the main discharge line and a discharge valve for opening and closing the main discharge line. The supply valve may close the supply line and the discharge valve may close the discharge line in the predetermined process. The supply valve may open the supply line and the discharge valve may close the discharge line to provide the cleaning solution into the vacuum holes in the cleaning process. The supply valve may close the supply line and the discharge valve may open the discharge line to discharge the cleaning solution from the vacuum holes in the cleaning process.

In other example embodiments, the cleaning part may additionally include a three way valve disposed at a connection point among the main supply line, the main discharge line and the common branched lines. The three way valve may be opened toward the common branched lines in the predetermined process. The three way valve may be opened toward the main supply line and the common branched lines to provide the cleaning solution into the vacuum holes in the cleaning process. The three way valve may be opened toward the main discharge line and the common branched lines to discharge the cleaning solution from the vacuum holes in the cleaning process.

In example embodiments, the apparatus for processing a substrate may additionally include a flow measurement part configured to provide the cleaning solution into the vacuum holes by a previously set amount, and a pumping part configured to discharge the cleaning solution from the vacuum holes for a previous set time.

In example embodiments, the predetermined process may include a process of supplying a chemical liquid onto the substrate. A fume may be generated from the chemical liquid, and the cleaning solution may remove an extraneous matter containing the fume attached on insides of the vacuum holes.

According to still another aspect of the invention, there is provided an apparatus for processing a substrate. The apparatus for processing a substrate may include a floating stage comprising air holes configured to provide an air onto a rear face of a substrate and vacuum holes configured to apply a vacuum pressure to the rear face of the substrate while a predetermined process is performed on the substrate, a chemical liquid supply part configured to provide a chemical liquid onto the substrate moving over the floating state, an air supply part including an air line connected to the air holes; a vacuum suction part including a vacuum line connected to the vacuum holes, and a cleaning part configured to clean the vacuum holes in a cleaning process of cleaning the vacuum holes. The cleaning part may include a cleaning solution supply part configured to provide a cleaning solution into the vacuum holes and a cleaning solution discharge part configured to discharge the cleaning solution from the vacuum holes. A fume may be generated from the chemical liquid and the cleaning solution may remove an extraneous matter containing the fume attached on insides of the vacuum holes.

In other example embodiments, the cleaning solution supply part may include a supply line in fluid communication with the vacuum holes, and a three way supply valve connecting the supply line to the vacuum line. The cleaning solution discharge part may include a discharge line in fluid communication with the vacuum holes, and a three way discharge valve connecting the discharge line to the vacuum line. The three way supply valve may be disposed closer the vacuum holes than the three way discharge valve. The three way supply valve may close the supply line and the three way discharge valve may close the discharge line in the predetermined process. The three way supply valve may open the supply line and the three way discharge valve may close the discharge line to provide the cleaning solution into the vacuum holes in the cleaning process. The three way supply valve may close the supply line and the three way discharge valve may open the discharge line to discharge the cleaning solution from the vacuum holes in the cleaning process.

In other example embodiments, the cleaning solution supply part may include a supply line in fluid communication with the vacuum holes, and a three way supply valve connecting the supply line to the vacuum line. The cleaning solution discharge part may include a discharge line in fluid communication with the vacuum holes, and a three way discharge valve connecting the discharge line to the vacuum line. The three way discharge valve ma be disposed closer the vacuum holes than the three way supply valve. The three way supply valve may close the supply line and the three way discharge valve may close the discharge line in the predetermined process. The three way supply valve may open the supply line and the three way discharge valve may close the discharge line to provide the cleaning solution into the vacuum holes in the cleaning process. The three way supply valve may close the supply line and the three way discharge valve may open the discharge line to discharge the cleaning solution from the vacuum holes in the cleaning process.

In some example embodiments, the vacuum line may include a main vacuum line, and branched vacuum lines divided from the main vacuum line and connected to the vacuum holes. The cleaning solution supply part and the cleaning solution part may be connected to the main vacuum line.

In example embodiments, the apparatus for processing a substrate may additionally include a flow measurement part configured to provide the cleaning solution into the vacuum holes by a previously set amount and a pumping part configured to discharge the cleaning solution from the vacuum holes for a previous set time.

According to example embodiments of the invention, the extraneous matter attached on the insides of the vacuum holes may be completely removed without scattering the outside of the vacuum holes so that the vacuum holes may be partially or entirely blocked. Additionally, the vacuum pressure may be efficiently applied to the rear face of the substrate while performing the predetermined process on the substrate since the vacuum holes may not be blocked by the extraneous matter. Furthermore, the vacuum holes 15 may be cleaned periodically or as occasion demands while repeatedly performing the predetermined process on the substrate, to thereby improving the stability of the predetermined process and enhancing the reliability of the semiconductor device or the display device manufactured using the apparatus for processing a substrate.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/ or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail with reference to the accompanying drawings. Like elements or components can be indicated by like reference numerals throughout the drawings, and the repeated explanations of like elements or components may be omitted.

Figure 1:
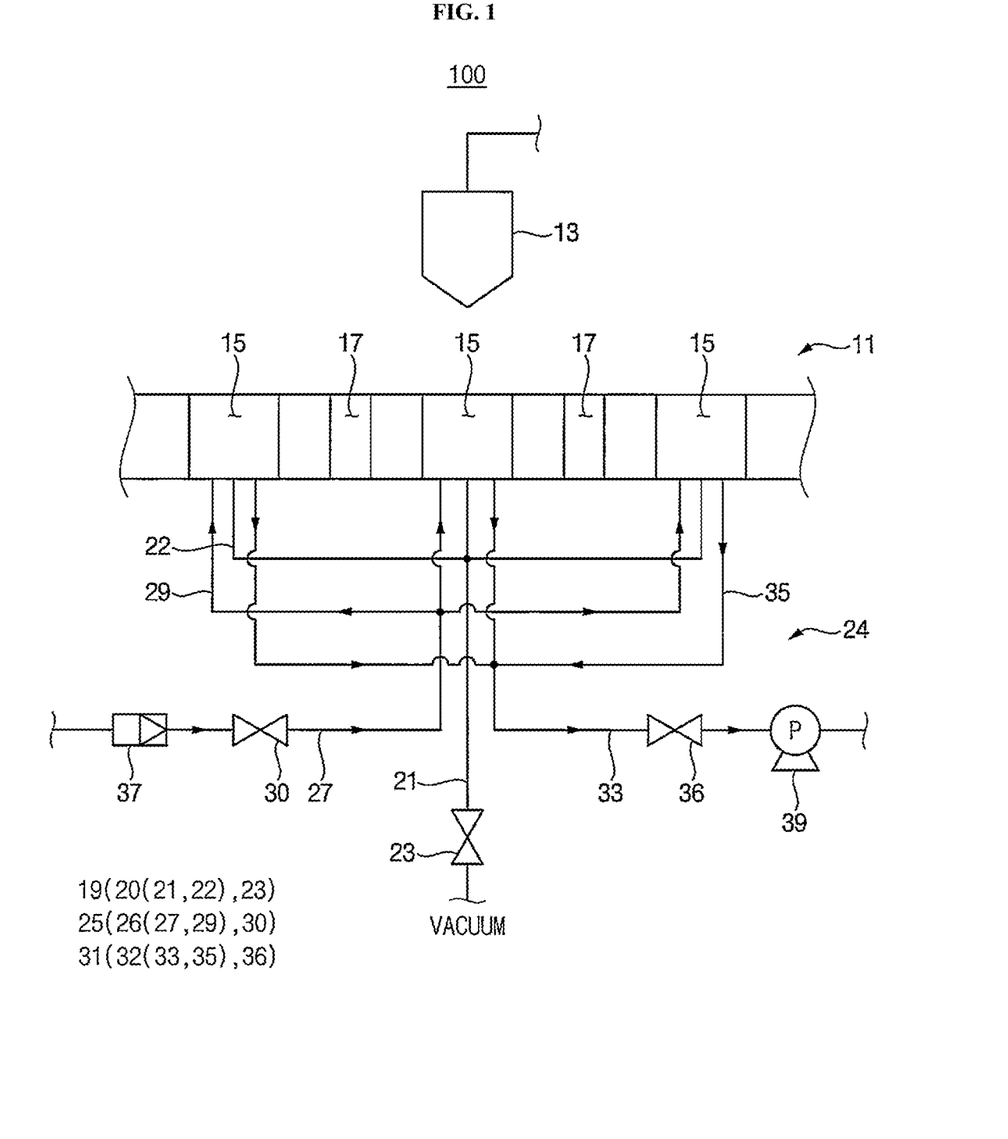
FIG. 1 is a schematic diagram illustrating an apparatus for processing a substrate in accordance with example embodiments of the invention.

FIG. 1 is a schematic diagram illustrating an apparatus for processing a substrate in accordance with example embodiments of the invention.

Referring to FIG. 1, an apparatus for processing a substrate 100 according to example embodiments may be configured to perform a predetermined process on a substrate for manufacturing an integrated circuit device. The apparatus for processing a substrate 100 may include a vacuum suction part 19 having a plurality of vacuum holes 15. The vacuum suction part 19 may absorb the substrate by applying a vacuum pressure on a bottom face of the substrate through the vacuum holes 15 when the predetermined process is executed on the substrate. To this end, the vacuum suction part 19 may include a plurality of vacuum lines 20 in fluid communication with the vacuum holes 15 to provide the vacuum pressure onto the rear face of the substrate.

In example embodiments, the vacuum suction part 19 is usually mounted in a floating stage 11 that may levitate the substrate there over in the predetermined process. For example, the apparatus for processing a substrate 100 may include a chemical liquid supply apparatus including the floating state 11, which may float the substrate and provide the chemical liquid onto the substrate while transferring the substrate there over. In this case, the apparatus for processing a substrate 100 may additionally include a chemical liquid supply part 13 capable of discharging the chemical liquid onto the substrate.

In some example embodiments, the apparatus for processing a substrate 100 may include an air supply part having a plurality of air holes 17. The air supply part may also be mounted in the floating stage 11. Although it is not shown, the air supply part may include a plurality of air lines in fluid communication with the air holes 17, which may provide an air to the rear face of the substrate through air holes 17. Here, the vacuum holes 15 of the vacuum suction part 19 and the air holes 17 of the air supply part may be arranged in the floating stage 11 by a substantially constant interval.

In example embodiments, as illustrated in FIG. 1, the vacuum suction part 19 may include one main vacuum line 21 and a plurality of branched vacuum lines 22 divided from the main vacuum line 21. The plurality of branched vacuum lines 22 may be connected to the plurality vacuum holes 15, respectively. Thus, the vacuum pressure may be applied to the rear face of the substrate through the vacuum holes 15 and the branched vacuum lines 22 via the main vacuum line 21 from a vacuum pressure source (not illustrated). In some example embodiments, the air supply part may include one main air line and a plurality of branched air lines divided from the main air line. The plurality of branched air lines may be connected to the plurality of air holes 17, respectively. Hence, the air may be applied to the rear face of the substrate through the air holes 17 and the branched air lines via the main air line from an air source (not illustrated).

In example embodiments, fume may be generated from the chemical liquid when a process of supplying the chemical liquid may be performed on the substrate levitated over the floating stage 11. For example, the fume may be generated at a peripheral portion of the substrate from the chemical liquid including photoresist the while coating the chemical liquid including photoresist on the substrate using the apparatus for processing a substrate 100. Such fume may be absorbed into the vacuum holes 15 of the vacuum suction part 19, and then may be removed. As the process of supplying the chemical liquid are repeatedly executed on the substrate, the fume and/or other impurities may be attached on insides of the vacuum holes 15, and thus the vacuum holes 15 may be partially or entirely blocked. Considering such as problem, the apparatus for processing a substrate 100 may additionally include a cleaning part 24 which may remove extraneous matters containing the fume and/or other impurities attached on the insides of the vacuum holes 15.

In example embodiments, the cleaning part 24 may include a cleaning solution supply part 25 and a cleaning solution discharge part 31. The cleaning solution supply part 25 may provide a cleaning solution into the vacuum holes 15 to remove the extraneous matter containing the fume and/or other impurities from the vacuum holes 15. The cleaning solution discharge part 31 may discharge the cleaning solution from the vacuum holes 15 and the rear face of the substrate to an outside. In this case, the cleaning part 24 may clean the vacuum holes 15 using the liquid phase cleaning solution such that the extraneous matter removed from the insides of the vacuum holes 15 may not be scattered from the vacuum holes 15.

The cleaning solution supplied from the cleaning part 24 into the vacuum holes 15 may include an organic solvent capable of dissolving the extraneous matters attached on the insides of the vacuum holes 15. For example, the cleaning solution may include benzene, toluene, ethyl acetate, acetone, alcohol and the combinations thereof for dissolving the extraneous matters derived from photoresist. As described above, the vacuum holes 15 may be washed using the cleaning part 24 including the cleaning solution supply part 25 such that the extraneous matters attached to the inside of the vacuum holes 15 may be efficiently removed and easily discharged. Therefore, the vacuum holes 15 may be prevented from being partially or entirely blocked.

The above process of cleaning the vacuum holes 15 using the cleaning part 24 may be executed before or after the predetermined process (e.g., the process of supplying the chemical liquid). However, the process of cleaning the vacuum holes 15 may be properly carried out as occasion demands.

In example embodiments, the cleaning solution supply part 25 of the cleaning part 24 may include a supply line 26 connected to the vacuum holes 15 and a supply valve 30 for opening and closing the supply line 26. The cleaning solution discharge part 31 may include a discharge line 32 connected to the vacuum holes 15 and a discharge valve 36 for opening and closing the discharge line 32. The supply line 26 of the cleaning solution supply part 25 may include one main supply line 27 connected to a cleaning solution source (not illustrated) and a plurality of branched supply lines 29 divided from the one main supply line 27. The plurality of branched supply lines 29 may be connected to the plurality of vacuum holes 15, respectively. Here, the supply valve 30 may be installed in the main supply line 27. Additionally, the discharge line 32 of the cleaning solution discharge part 31 may include one main discharge line 33 and a plurality of branched discharge lines 35. The plurality of branched discharge lines 35 may be connected to the plurality of vacuum hole 15 and may be divided from the one main discharge line 33. The main discharge line 33 may be extended to the outside and the discharge valve 36 may be installed in the main discharge line 33.

In the apparatus for processing a substrate 100 according to example embodiments, when the predetermined process is performed on the substrate, the vacuum valve 23 in the vacuum line 20 may be opened to apply the vacuum pressure to the rear face of the substrate while the supply valve 30 in the supply line 26 and the discharge valve 36 in the discharge line 32 may be closed. When the cleaning process is executed about the vacuum holes 15, the supply valve 30 may be opened to provide the cleaning solution into the vacuum holes 15 while the vacuum valve 23 and the discharge valve 36 may be closed, respectively. Then, the discharge valve 36 may be opened to discharge the cleaning solution containing the aborbates toward the outside whereas the supply valve 30 may be closed. As such, the predetermined process and the cleaning process may be effetely performed by properly controlling the vacuum valve 23, the supply valve 30 and the discharge valve 36.

If the cleaning solution is excessively provided into the vacuum holes 15 in the cleaning process, the cleaning solution may overflow from the vacuum holes 15 so that openings of the vacuum holes 15 may be damaged by the cleaning solution. Further, if the cleaning solution flows into the air holes 17 adjacent to the vacuum holes 15, the substrate and features formed on the substrate may be damaged by the cleaning solution remaining in the air holes 17 when the predetermined process is performed on the substrate. Considering these problems, it is needed to exactly control an amount of the cleaning solution provided into the vacuum holes 15 during the cleaning process. In example embodiments, the apparatus for processing a substrate 100 may additionally include a flow measurement part 37 that can measure a flow rate of the cleaning solution supplied from the cleaning part 24 to the vacuum holes 15. Using the flow measurement part 37, the cleaning solution may be provided in a previously set amount from the cleaning solution supply part 25 into the vacuum holes 15. Specifically, when the previously set amount of cleaning solution is supplied into the vacuum holes 15, the flow measurement part 37 may control the supply valve 30 of the cleaning part 24 such that the cleaning solution is not provided from the cleaning solution supply part 25. For example, the supply valve 30 may include a solenoid valve and the flow measurement part 37 may communicate an electrical signal to the supply valve 30 to close the supply valve 30 when the previously set amount of the cleaning solution is provided into the vacuum holes 15. In this case, the flow measurement part 37 may be disposed in the one main supply line 27 of the supply line 26.

If the cleaning solution is not fully discharged from the vacuum holes 15 and partially remained in the vacuum holes 15, the extraneous matter contained in the cleaning solution may be reattached on the insides of the vacuum holes 15. In this case, when the predetermined process is executed about the substrate, not only the substrate and the vacuum holes 15 may be damaged but also the vacuum suction part 19 may be damaged by the reattached extraneous matter. Thus, it is needed to completely discharge the cleaning solution from the vacuum holes 15. To this end, the apparatus for processing a substrate 100 may additionally include a pumping part 39 to fully discharge the cleaning solution from the vacuum holes 15.

In example embodiments, the pumping part 39 may discharge the cleaning solution from the vacuum holes 15 for a previously set time. Such previously set time may be adjusted in accordance with the flow rate of the cleaning solution, an amount of the removed extraneous matter, etc. Here, the pumping part 39 may be disposed in the one main discharge line 33 of the discharge line 32.

As described above, the extraneous matter attached on the insides of the vacuum holes 15 may be completely removed without scattering the outside of the vacuum holes 15 so that the vacuum holes 15 may be partially or entirely blocked. Additionally, the vacuum pressure may be efficiently applied to the rear face of the substrate while performing the predetermined process on the substrate since the vacuum holes 15 may not be blocked by the extraneous matter. Furthermore, the vacuum holes 15 may be cleaned periodically or as occasion demands while repeatedly performing the predetermined process on the substrate, to thereby improving the stability of the predetermined process and enhancing the reliability of the semiconductor device or the display device manufactured using the apparatus for processing a substrate 100.

Figure 2:
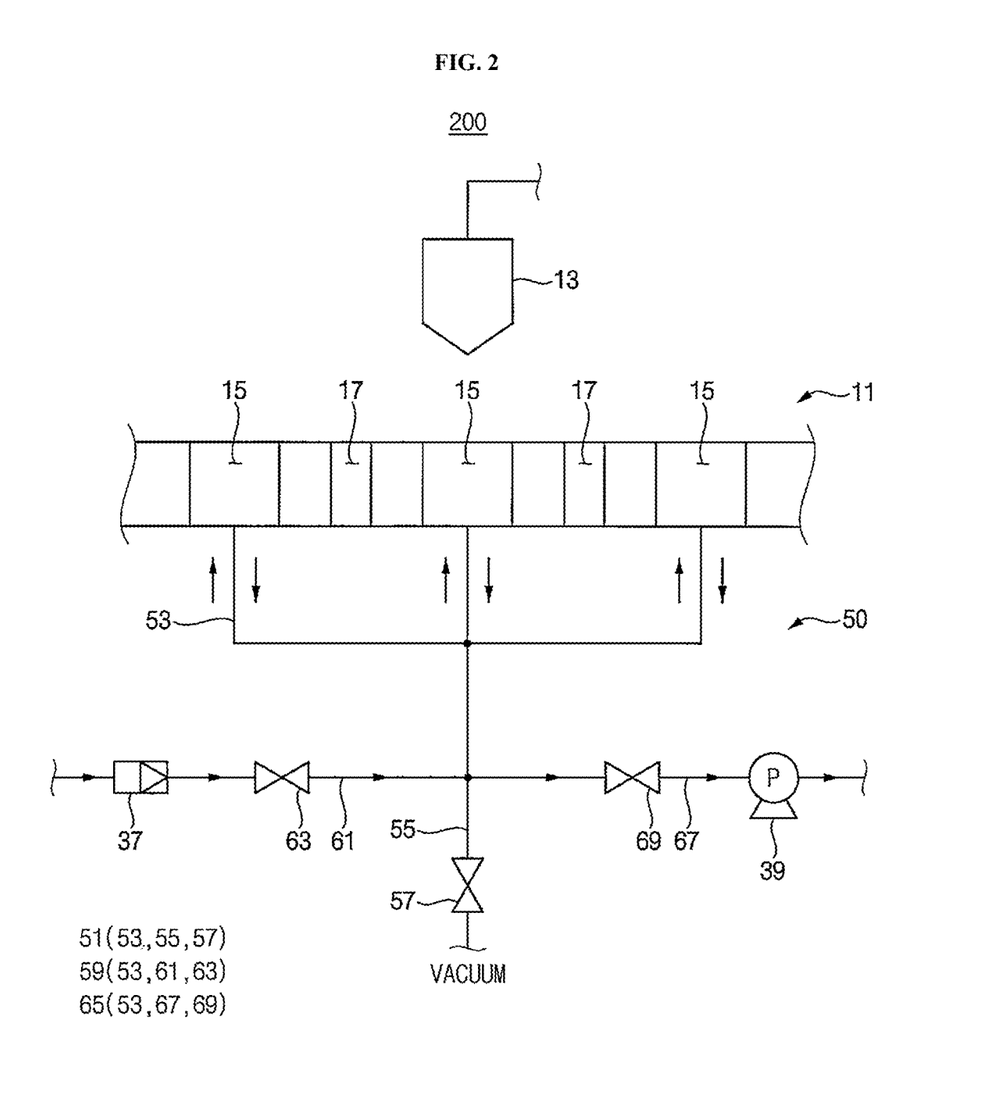
FIG. 2 is a schematic diagram illustrating an apparatus for processing a substrate in accordance with some example embodiments of the invention.

FIG. 2 is a schematic diagram illustrating an apparatus for processing a substrate in accordance with some example embodiments of the invention. In FIG. 2, an apparatus for processing a substrate 200 may have a configuration substantially identical or similar to that of the apparatus for processing a substrate 100 described with reference to FIG. 1 except a vacuum suction part 51 and a cleaning part 50. In FIG. 2, substantially identical or similar elements are indicated by the same reference numerals and repeated descriptions may be omitted.

Referring to FIG. 2, the apparatus for processing a substrate 200 may have a plurality of vacuum holes 15 and the plurality of vacuum holes 15 may be in fluid communication with a plurality of common branched lines 53.

The vacuum suction part 51 may include a main vacuum line 55 in fluid communication with the plurality of common branched lines 53. The main vacuum line 55 may be connected to the common branched lines 53 at a connection point. Further, the vacuum suction part 51 may include a vacuum valve 57 that may be disposed in the main vacuum line 55 to open and close the main vacuum line 55.

The cleaning part 50 may include a cleaning solution supply part 59 and a cleaning solution discharge part 65, and the cleaning solution supply part 59 may have a main supply line 61 in fluid communication with the common branched lines 53. The main supply line 61 may be connected to the common branched lines 53 at the connection point. In addition, the cleaning solution supply part 59 may include a supply valve 63 that may be disposed in the main supply line 61 to open and close the main supply line 61.

The cleaning solution discharge part 65 may include a main discharge line 67 in fluid communication with the common branched lines 53, and may additionally include a discharge valve 69 disposed in the main discharge line 67 to close and open the main discharge line 67. The main discharge line 67 may be connected to the common branched lines 53 at the connection point.

As described above, the apparatus for processing a substrate 200 may have a configuration in which all of the vacuum suction part 51, the cleaning solution supply part 59 and the cleaning solution discharge part 65 may be connected to the common branched lines 53. In other words, each of the common branched lines 53 connected to each of the vacuum holes 15 may be connected to the main vacuum line 55, the main supply line 61 and the main discharge line 67 at the connection point.

When a predetermined process (e.g., a process of supplying a chemical liquid) is performed on a substrate, the vacuum valve 57 may open the main vacuum line 55 to provide a vacuum pressure to a rear face of the substrate through the vacuum holes 15 while the supply valve 63 and the discharge valve 69 may close the main supply line 61 and the main discharge line 67, respectively. When a cleaning solution is provided into the vacuum holes 15 to clean insides of the vacuum holes 15, the supply valve 63 may open the main supply line 61 while the vacuum valve and the discharge valve 69 may close the main vacuum line 55 and the main discharge line 67. When the cleaning solution is discharged from the vacuum holes 15, the discharge valve 69 may open the main discharge line 67 while the vacuum valve 57 and the supply valve 63 may close the main vacuum line 55 and the main supply line 61.

Figure 3:
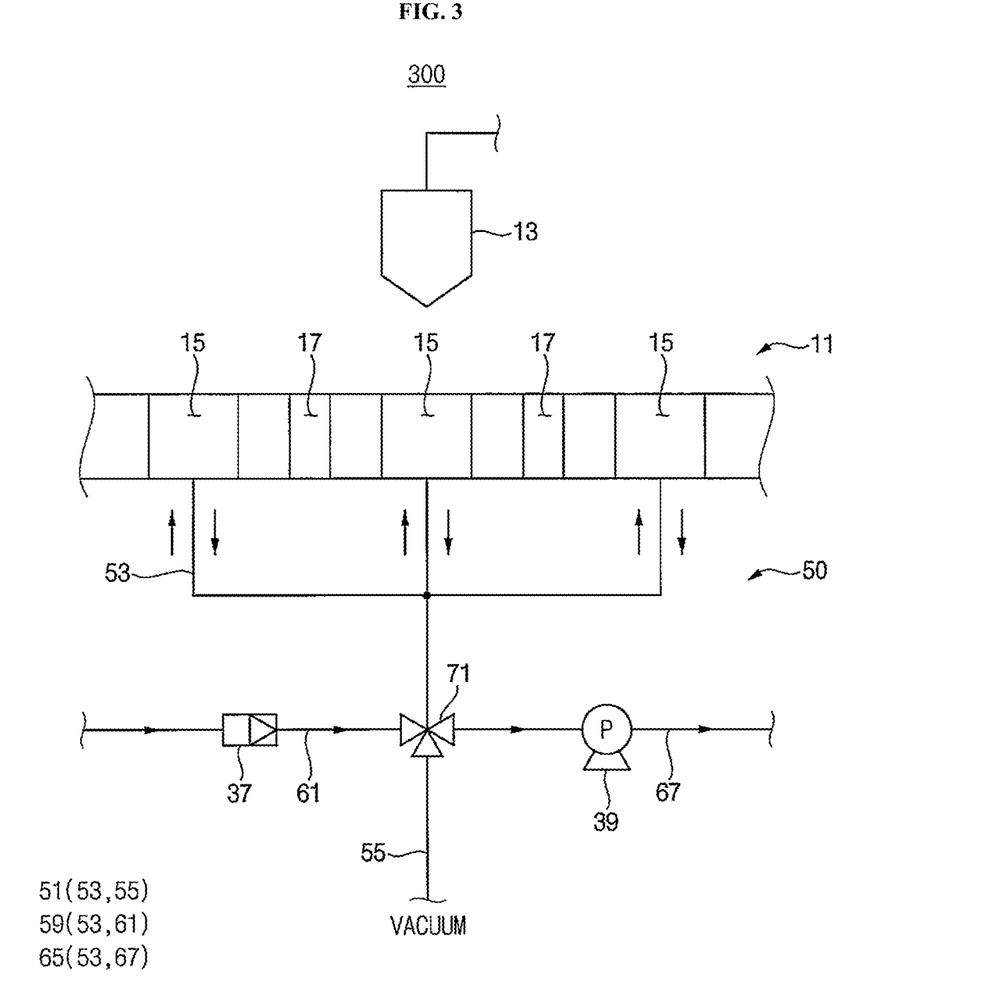
FIG. 3 is a schematic diagram illustrating an apparatus for processing a substrate in accordance with other example embodiments of the invention.

In some example embodiments, the apparatus for processing a substrate 200 may include a flow measurement part 37 and a pumping part 39. Therefore, an extraneous matter attached on the insides of the vacuum holes 15 may be completely removed without scattering the outside of the vacuum holes 15 such that the vacuum holes 15 may be partially or entirely blocked. In addition, the vacuum holes 15 may be cleaned periodically or as occasion demands while repeatedly performing the predetermined process on the substrate, FIG. 3 is a schematic diagram illustrating an apparatus for processing a substrate in accordance with other example embodiments of the invention. In FIG. 3, an apparatus for processing a substrate 300 may have a configuration substantially identical or similar to that of the apparatus for processing a substrate 200 described with reference to FIG. 2 except a vacuum suction part 51 and a cleaning part 50. In FIG. 3, substantially identical or similar elements are indicated by the same reference numerals and repeated descriptions may be omitted.

Referring to FIG. 3, the apparatus for processing a substrate 300 may include a plurality of vacuum holes 15 and the plurality of vacuum holes 15 may be in fluid communication with a plurality of common branched lines 53.

The vacuum suction part 51 may include a main vacuum line 55 connected to the common branched lines 53 at a connection point. The cleaning part 50 may include a cleaning solution supply part 59 and a cleaning solution discharge part 65. The cleaning solution supply part 59 may include a main supply line 61 connected to the common branched lines 53 at the connection point. The cleaning solution discharge part 65 may include a main discharge line 67 connected to the common branched lines 53 at the connection point. Similarly, the apparatus for processing a substrate 300 may have a configuration in which all of the vacuum suction part 51, the cleaning solution supply part 59 and the cleaning solution discharge part 65 may be connected to the common branched lines 53.

In other example embodiments, the apparatus for processing a substrate 300 may include a three way valve 72 disposed at the connection point. This three way valve 72 may control the connections among the common branched lines 53, the main vacuum line 55, the main supply line 61 and the main discharge line 67. In other words, opening and closing directions of the three way valve 72 may be changed in accordance with a predetermined process and a cleaning process. Specifically, when the predetermined process is performed on a substrate, the three way valve 72 may be opened toward the main vacuum line 55 to provide a vacuum pressure to a rear face of the substrate through the vacuum holes 15. When a cleaning solution is provided into the vacuum holes 15, the three way valve 72 may be opened toward the main supply line 61 to clean insides of the vacuum holes 15. When the cleaning solution is discharged from the vacuum holes 15, the three way valve 72 may be opened toward the main discharge line 67.

In other example embodiments, the apparatus for processing a substrate 300 may include a flow measurement part 37 and a pumping part 39. Therefore, an extraneous matter attached on the insides of the vacuum holes 15 may be completely removed without scattering the outside of the vacuum holes 15 such that the vacuum holes 15 may be partially or entirely blocked. In addition, the vacuum holes 15 may be cleaned periodically or as occasion demands while repeatedly performing the predetermined process on the substrate.

The apparatus for processing a substrate 300 illustrated in FIG. 3 may have a simple configuration compared to the conventional apparatus for processing a substrate since the apparatus for processing a substrate 300 may not require separate branched supply lines and separate branched discharge lines.

Figure 4:
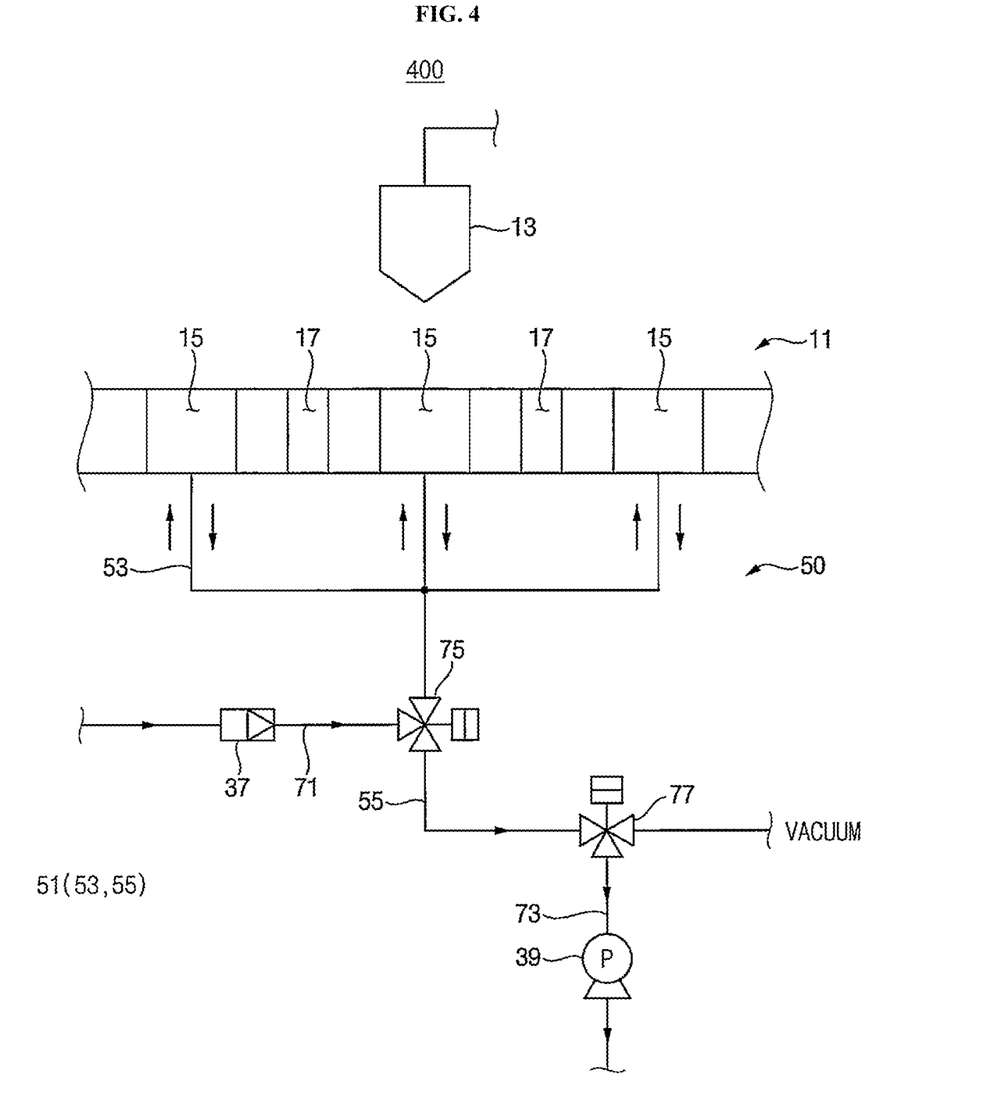
FIG. 4 is a schematic diagram illustrating an apparatus for processing a substrate in accordance with still other example embodiments of the invention.

FIG. 4 is a schematic diagram illustrating an apparatus for processing a substrate in accordance with still other example embodiments of the invention. In FIG. 4, an apparatus for processing a substrate 400 may have a configuration substantially identical or similar to that of the apparatus for processing a substrate 300 described with reference to FIG. 3 except a vacuum suction part 51 and a cleaning part 50. In FIG. 4, substantially identical or similar elements are indicated by the same reference numerals and repeated descriptions may be omitted.

Referring to FIG. 4, the vacuum suction part 50 of the apparatus for processing a substrate 400 may include a plurality of vacuum holes 15, one main vacuum line 55 and a plurality of branched vacuum lines 53. The plurality of branched vacuum lines 53 may be in fluid communication with the plurality of vacuum holes 15 and may be divided from the main vacuum line 55. As such, a vacuum pressure may be applied to a rear face of a substrate through the main vacuum line 55, the branched vacuum lines 53 and the vacuum holes 15.

The cleaning part 50 may include a cleaning solution supply part and a cleaning solution discharge part as described above. The cleaning solution supply part may include a supply line 71 and a three way supply valve 75 in order to provide a cleaning solution into the vacuum holes 15 through the main and branched supply lines 55 and 53. In this case, the three way supply valve 75 may be installed in the main vacuum line 55 and may connect the supply line 71 to the main vacuum line 55. The cleaning solution discharge part may include a discharge line 73 and a three way discharge valve 77 so as to discharge the cleaning solution from the vacuum holes 15 through the main and branched supply lines 55 and 53. Here, the three way discharge valve 75 may be installed in the main vacuum line 55 and may connect the discharge line 71 to the main vacuum line 55. In addition, the three way supply valve 75 may be closer to the vacuum holes 15 than the three way discharge valve 75.

Opening and closing directions of the three way supply valve 75 and the three way discharge valve 77 may be changed in accordance with a predetermined process and a cleaning process. Specifically, when the predetermined process is performed on a substrate, the three way supply valve 75 may be disconnect the supply line 71 from the main vacuum line 55 and may be opened toward the main vacuum line 55 only. At this time, the three way discharge valve 77 may be closed. When a cleaning solution is provided into the vacuum holes 15, the three way supply valve 72 may connect the supply line 71 to the main vacuum line 55 and the three way discharge valve 77 may be closed. When the cleaning solution is discharged from the vacuum holes 15, the three way discharge valve 77 may connect the discharge line 73 to the main vacuum line 55.

In still other example embodiments, the apparatus for processing a substrate 400 may include a flow measurement part 37 and a pumping part 39. Therefore, an extraneous matter attached on the insides of the vacuum holes 15 may be completely removed without scattering the outside of the vacuum holes 15 such that the vacuum holes 15 may be partially or entirely blocked. In addition, the vacuum holes 15 may be cleaned periodically or as occasion demands while repeatedly performing the predetermined process on the substrate.

The apparatus for processing a substrate 400 illustrated in FIG. 4 may have a simple configuration compared to the conventional apparatus for processing a substrate since the apparatus for processing a substrate 400 may include the vacuum lines 53 and 55, the supply line 71 and the discharge line 77 without separate branched supply lines and separate branched discharge lines.

Figure 5:
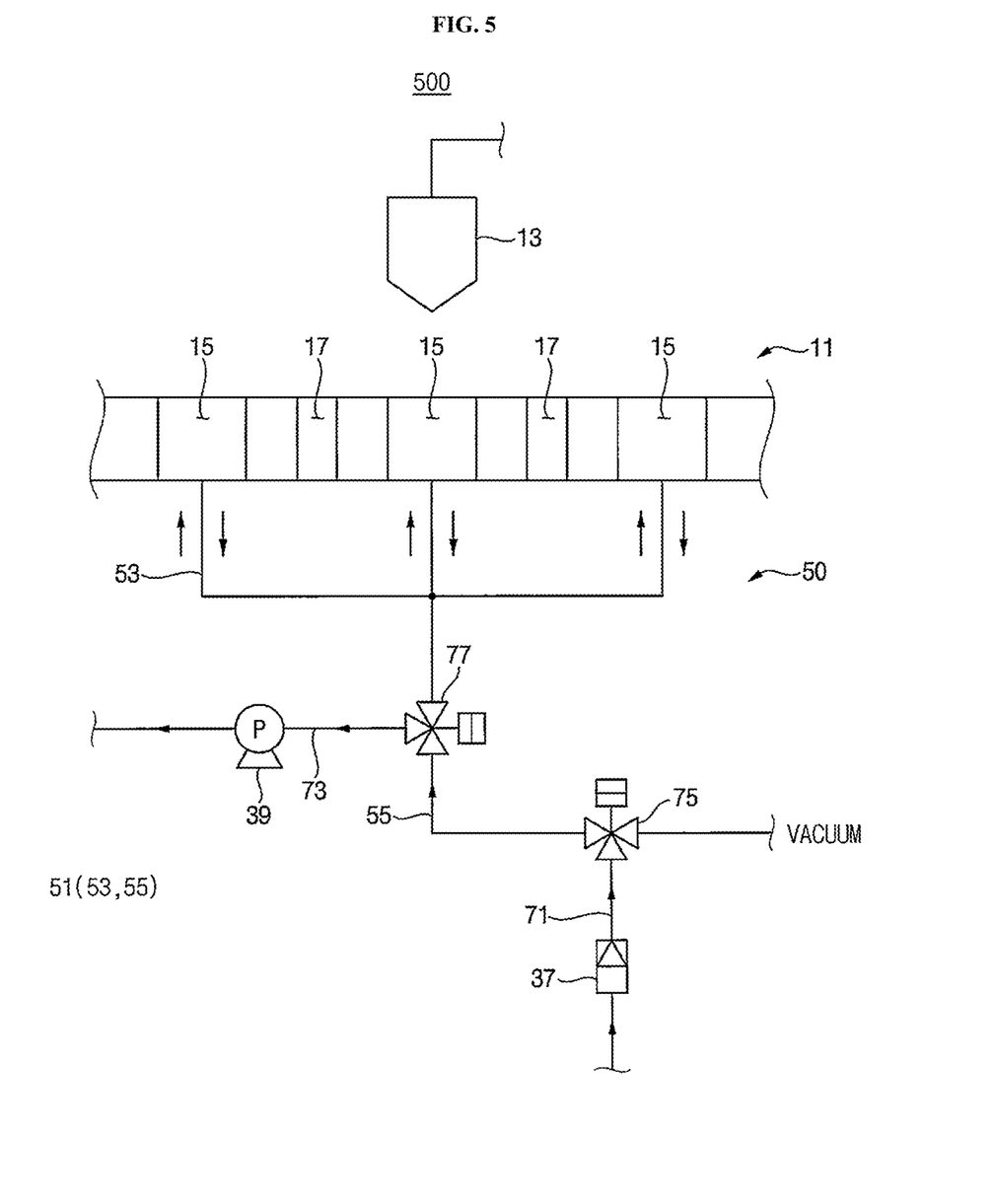
FIG. 5 is a schematic diagram illustrating an apparatus for processing a substrate in accordance with still other example embodiments of the invention.

FIG. 5 is a schematic diagram illustrating an apparatus for processing a substrate in accordance with some example embodiments of the invention. In FIG. 5, an apparatus for processing a substrate 500 may have a configuration substantially identical or similar to that of the apparatus for processing a substrate 400 described with reference to FIG. 4 except a vacuum suction part 51 and a cleaning part 50. In FIG. 5, substantially identical or similar elements are indicated by the same reference numerals and repeated descriptions may be omitted.

Referring to FIG. 5, a discharge line 73 of the cleaning part 50 may be disposed closer to vacuum holes 15 of the vacuum suction part 51 in comparison with a supply line 51 of the cleaning part 50. Further, a three way discharge valve 77 of a cleaning solution discharge part may be disposed closer to the vacuum holes 15 of the vacuum suction part 51 in comparison with a three way supply valve 75 of a cleaning solution supply part.

Similarly, opening and closing directions of the three way supply valve 75 and the three way discharge valve 77 may be changed in accordance with a predetermined process and a cleaning process. Specifically, when the predetermined process is performed on a substrate, the three way supply valve 75 may be disconnect the supply line 71 from the main vacuum line 55 and may be opened toward the main vacuum line 55 only, and the three way discharge valve 77 may be closed. When a cleaning solution is provided into the vacuum holes 15, the three way supply valve 72 may connect the supply line 71 to the main vacuum line 55 and the three way discharge valve 77 may be closed. When the cleaning solution is discharged from the vacuum holes 15, the three way discharge valve 77 may connect the discharge line 73 to the main vacuum line 55.

In still other example embodiments, the apparatus for processing a substrate 500 may include a flow measurement part 37 and a pumping part 39. Therefore, an extraneous matter attached on the insides of the vacuum holes 15 may be completely removed without scattering the outside of the vacuum holes 15 such that the vacuum holes 15 may be partially or entirely blocked. In addition, the vacuum holes 15 may be cleaned periodically or as occasion demands while repeatedly performing the predetermined process on the substrate.

The apparatus for processing a substrate 500 illustrated in FIG. 5 may have a simple configuration compared to the conventional apparatus for processing a substrate since the apparatus for processing a substrate 500 may include the vacuum lines 53 and 55, the supply line 71 and the discharge line 77 without separate branched supply lines and separate branched discharge lines.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An apparatus for processing a substrate, comprising:
   a vacuum suction part including vacuum holes configured to apply a vacuum pressure to a rear face of the substrate while a desired process is performed on the substrate; and
   a cleaning part configured to clean the vacuum holes in a cleaning process of cleaning the vacuum holes,
   wherein the cleaning part comprises:
      a supply line structure in fluid communication with the vacuum holes, the supply line structure including one main supply line and a plurality of branched supply lines divided from the main supply line, the branched supply lines corresponding to the vacuum holes, respectively;

a supply valve configured to open and close the supply line structure;

a discharge line structure in fluid communication with the vacuum holes, the discharge line structure including one main discharge line and a plurality of branched discharge lines divided from the main discharge line, the branched discharge lines corresponding to the vacuum holes, respectively; and a discharge valve configured to open and close the discharge line structure, wherein the supply valve is configured to close the supply line structure and the discharge valve is configured to close the discharge line structure in the desired process, the supply valve is configured to open the supply line structure and the discharge valve is configured to close the discharge line structure to provide a cleaning solution into the vacuum holes in the cleaning process, and the supply valve is configured to close the supply line structure and the discharge valve is configured to open the discharge line structure to discharge the cleaning solution from the vacuum holes in the cleaning process, wherein the cleaning part is configured to remove an extraneous matter containing a fume generated from a chemical liquid and attached to insides of the vacuum holes using the cleaning solution, and wherein the supply line structure and the discharge line structure are separate structures from each other.

2. The apparatus of claim 1, wherein:
the supply valve is in the main supply line, and
the discharge valve is in the main discharge line.

3. The apparatus of claim 1, wherein the cleaning part is further configured to:
provide the cleaning solution into the vacuum holes by a previously set amount; and
discharge the cleaning solution from the vacuum holes for a previously set time.

4. The apparatus of claim 1, wherein:
the desired process comprises a process of supplying the chemical liquid onto the substrate.

5. An apparatus for processing a substrate, comprising:
a floating stage comprising air holes configured to provide an air onto a rear face of the substrate and vacuum holes configured to apply a vacuum pressure to the rear face of the substrate while a desired process is performed on the substrate; and
a cleaning part configured to provide a cleaning solution into the vacuum holes and discharge the cleaning solution from the vacuum holes to clean the vacuum holes in a cleaning process of cleaning the vacuum holes, wherein the cleaning part comprises:
a supply line structure in fluid communication with the vacuum holes, the supply line structure including one main supply line and a plurality of branched supply lines divided from the main supply line, the branched supply lines corresponding to the vacuum holes, respectively;
a supply valve configured to open and close the supply line structure;
a discharge line structure in fluid communication with the vacuum holes, the discharge line structure including one main discharge line and a plurality of branched discharge lines divided from the main discharge line, the branched discharge lines corresponding to the vacuum holes, respectively; and
a discharge valve configured to open and close the discharge line structure,
wherein the supply valve is configured to close the supply line structure and the discharge valve is configured to close the discharge line structure in the desired process,
the supply valve is configured to open the supply line structure and the discharge valve is configured to close the discharge line structure to provide the cleaning solution into the vacuum holes in the cleaning process, and
the supply valve is configured to close the supply line structure and the discharge valve is configured to open the discharge line structure to discharge the cleaning solution from the vacuum holes in the cleaning process, and
wherein the cleaning part is configured to remove an extraneous matter containing a fume generated from a chemical liquid and attached to insides of the vacuum holes using the cleaning solution, and
wherein the supply line structure and the discharge line structure are separate structures from each other.

6. The apparatus of claim 5, wherein;
the supply valve is in the main supply line, and
the discharge valve is in the main discharge line.

7. The apparatus of claim 5, wherein the cleaning part is further configured to:
provide the cleaning solution into the vacuum holes by a previously set amount; and
discharge the cleaning solution from the vacuum holes for a previous set time.

8. The apparatus of claim 5, wherein:
the desired process comprises the process of supplying the chemical liquid onto the substrate.

* * * * *